(12) United States Patent
Williams

(10) Patent No.: US 6,990,163 B2
(45) Date of Patent: Jan. 24, 2006

(54) APPARATUS AND METHOD FOR ACQUIRING PHASE LOCK TIMING RECOVERY IN A PARTIAL RESPONSE MAXIMUM LIKELIHOOD (PRML) CHANNEL

(75) Inventor: Stephen Williams, Whitefield (GB)

(73) Assignee: LSI Logic Corporation, Milpitas, CA (US)

( * ) Notice: Subject to any disclaimer, the term of this patent is extended or adjusted under 35 U.S.C. 154(b) by 757 days.

(21) Appl. No.: 09/948,015

(22) Filed: Sep. 6, 2001

(65) Prior Publication Data

US 2002/0061087 A1    May 23, 2002

(30) Foreign Application Priority Data

Nov. 21, 2000    (GB)    ................................. 002853

(51) Int. Cl.
H03D 3/24    (2006.01)
(52) U.S. Cl. .................. 375/376; 375/371; 375/373
(58) Field of Classification Search ................ 375/376, 375/354, 371, 373; 327/553, 156, 141; 360/65
See application file for complete search history.

(56) References Cited

U.S. PATENT DOCUMENTS

| | | | | |
|---|---|---|---|---|
| 5,694,088 A | * | 12/1997 | Dickson | ........................ 331/12 |
| 5,745,315 A | * | 4/1998 | Aoyama | ........................ 360/65 |
| 5,943,382 A | * | 8/1999 | Li et al. | ........................ 375/376 |
| 6,150,887 A | * | 11/2000 | Yamaguchi | ........................ 331/11 |
| 6,313,789 B1 | * | 11/2001 | Zhodzishsky et al. | . 342/357.12 |
| 6,509,773 B2 | * | 1/2003 | Buchwald et al. | ........... 327/248 |

FOREIGN PATENT DOCUMENTS

GB    2333194    7/1999

OTHER PUBLICATIONS

"A 240-Mbps, 1-W CMOS EPRML Read-Channel LSI Chip Using an Interleaved Subranging Pipeline A/D Converter", By Tatsuji Matsuura et al., IEEE Journal of Solid-State Circuits, vol. 33, No. 11, Nov. 1998, pp. 1840-1850.
"A PRML Detector for a DVDR System", By Chang Hun Lee et al., IEEE Transactions on Consumer Electronics, vol. 45, No. 2, May 1999, pp. 278-285.
"Transistion Detector for CD and DVD", By J.W.M. Bergmans, et al., IEEE Transactions on Consumer Electronics, vol. 46, No. 1, Feb. 2000, pp. 16-19.

* cited by examiner

Primary Examiner—Stephen Chin
Assistant Examiner—Erin M. File
(74) Attorney, Agent, or Firm—Christopher P. Maiorana, PC

(57) ABSTRACT

The present invention is a method of acquiring phase lock to a data signal in a digital channel having a digital feedback loop. The method generally comprises: (A) applying the data signal to an analog phase lock loop configured to have (i) at least two poles and (ii) presend intermediate output signal frequency locked to the data signal; (B) applying the data signal and the intermediate output signal to the digital channel; and (C) adjusting a delay constant for the digital feedback loop to (i) compensate for variations in phase between the data signal and the intermediate output signal and (ii) acquire phase lock by using a single pole in the digital channel.

21 Claims, 6 Drawing Sheets

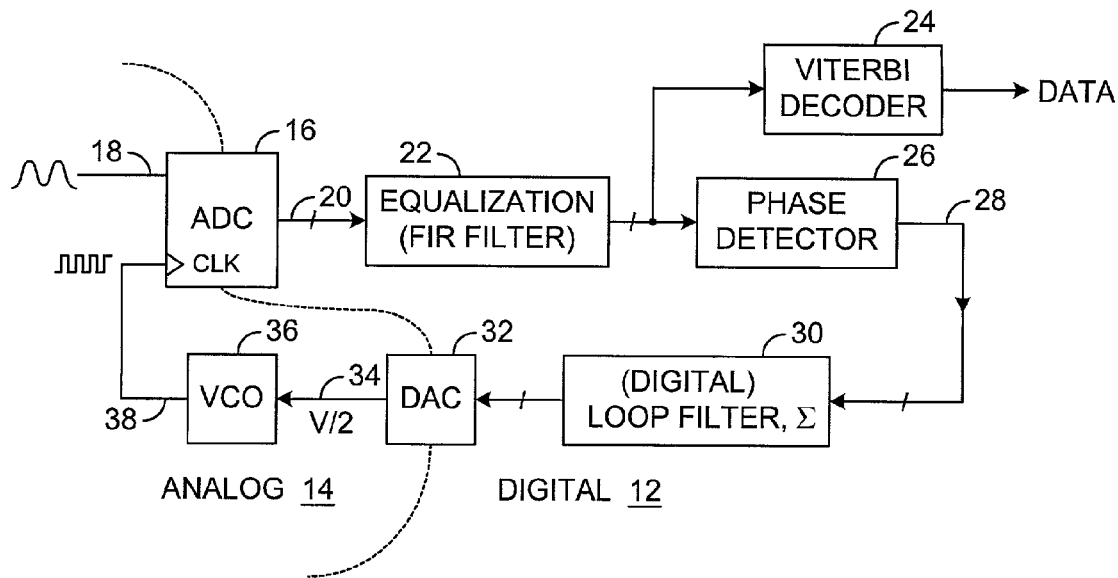
FIG. 1
(CONVENTIONAL)
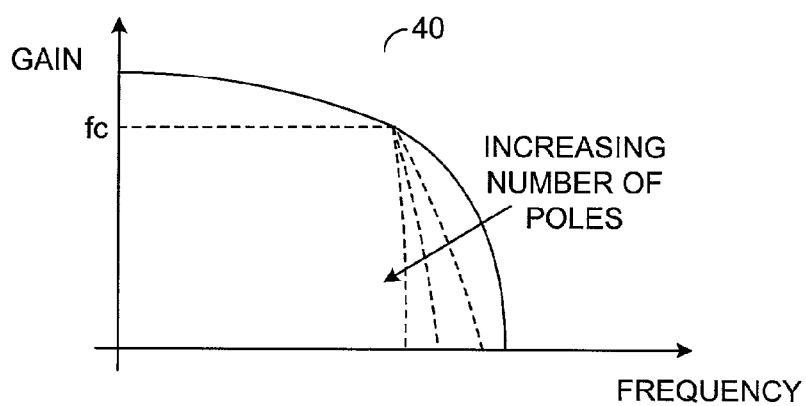
FIG. 2
(CONVENTIONAL)

APPARATUS AND METHOD FOR ACQUIRING PHASE LOCK TIMING RECOVERY IN A PARTIAL RESPONSE MAXIMUM LIKELIHOOD (PRML) CHANNEL

This application claims the benefit of United Kingdom Application No. 0028532.3 filed Nov. 21, 2000.

FIELD OF THE INVENTION

This invention relates, in general, to an apparatus and method for acquiring phase lock timing recovery in a digital channel. The present invention is particularly, but not exclusively, applicable to the provisioning of a delay locked loop (DLL) scheme for an optical device, such as a digital versatile disc (DVD) supporting random access memory (RAM) or read only memory (ROM) applications, where the digital channel is subject to partial response maximum likelihood (PRML) data recovery techniques.

BACKGROUND OF THE INVENTION

There are several competing formats for optical data storage. The formats are essentially DVD ROM, compact disc (CD) ROM, and DVD read-write (RW) plus and minus. There is also DVD RAM that has optical read capabilities, as well as optical DVD RAM write. A significant issue, however, arises with internal signal processing requirements of such DVD and CD ROM machines, namely that the signal processing required to support certain formats and ever-increasing operating speeds differs according to the optical formatting of the disc. Consequently, there is no common signal processing platform.

With a multiplicity of possible formats, manufacturers have been considering the provision of a unitary machine that is capable of supporting at least some (and preferably all) of these optical disc formats. In this latter respect, a consolidated optical disc standard known as "DVD multi" is presently being defined.

As will be understood, the reason for increasing the speed of devices is for data access and visual scanning/image manipulation. Essentially, if real-time video is played at 1×, then you require 4× for relatively fast picture scanning, for example, in DVD players and 16× (as is generally demanded) for personal computers (PCs). Framing this in context, 4× scanning of a movie of DVD ROM may be sufficient, but 4× scanning of an encyclopedia on DVD ROM would be laboursome, hence the requirement for 16×. In another example, with respect to DVD RAM read-write, a technical issue that has affected both device development and commercial availability relates to head oscillation between read and write functions. Specifically, if you require 4× optical read capabilities in the DVD RAM read-write device, then you need at least 8× performance (assuming an equal division between read and write functions) to split between the read and write functions. Taking into account stabilization times and a general noise environment, the provision of DVD RAM at 4× and beyond is technically demanding.

Unfortunately, with increased speed, there are reduced operational margins and hence a likelihood of increased error rates. In other words, while the noise floor remains ostensibly constant, the ability to resolve information bearing "pits" (supporting, for example, eight-fourteen modulation, efm) becomes increasing more difficult. Clearly, any inability to recover or write information in an accurate fashion results in loss or corruption of data.

To mitigate the affects of noise, in general, it has been proposed that PRML (i.e., synchronous) technology can be employed to enhance noise protection in communication paths. Unfortunately, PRML (while having wide applicability in both radio and optical channels) places significant demands on processing and circuit overhead, since PRML, as will be understood, requires the use of flash converters, Viterbi decoders, etc.

Timing recovery is conventionally the term given in the context of data read channels to describe the process of locking the phase and frequency of a clock to that of the incoming data stream. PRML channels are data channels that employ some form of discrete-time sampling of the incoming signal to effect equalization, timing recovery and data recovery (i.e. the process of correctly identifying the nature of each bit in the stream). By their nature, therefore, PRML timing recovery schemes traditionally involve an element of analog-to-digital (A-to-D) sampling and the employment of some form of digital phase lock loop (PLL).

Digital PLLs, by their nature, involve digital processing of the sampled data stream. Digital PLL processing can be quite complex and encompass a digital loop filter that contributes "latency" to the feedback path of the PLL. Indeed, the conventional use of digital components (in the digital PLL required for PRML) results in a high degree of latency in processing. It is well known that high levels of latency in feedback systems leads to instability, particularly where high gain is introduced to the scheme in order to achieve, for example, acceptable lock acquisition capture ranges in the case of PLLs. In other words, in practical terms, the high degree of latency causes the PLL to exhibit poor phase margin, with this adversely affecting an ability of the digital PLL to acquire stabilisation. The problem can be further exasperated by the need to include some form of equalizer and pipelined A-to-D converter architecture in the timing recovery feedback loop. Consequently, with a digital PLL, an ability to drive the digital loop with high gain, required for a good/acceptable capture range, is unfortunately significantly restricted. It will be understood that the term "capture range" is the initial frequency offset with which the PLL can work to acquire lock.

In the context of PRML, the use of digital channels means that a read signal (in the exemplary sense of an optical storage device) is sampled, quantized and fed into a Viterbi detector for data recovery, with the digital channel requiring use of a digital phase lock loop (PLL). Consequently, phase detection is achieved through a computational operation performed on a sampled digital sequence, with the "loop filter" realised by an arithmetic computation (as opposed to a conventional resistor-capacitor ladder filter in a corresponding analog domain). Conventional digital implementation of the PRML integrally incorporates an analog-to-digital converter (ADC) into the feedback loop, with the PLL invariably configured to operate on an equalised signal emanating from a digital filter, such as a finite impulse response (FIR) filter.

For completeness, fundamental operational differences between a digital PLL and its analog counterpart are now highlighted. Rather than having phase differences computed from a sampled sequence, an analog PLL infers phase error from a comparison between edges of a reference clock and a read signal. Furthermore, the analog PLL inherently exhibits less latency, but is unable to provide a digitally sampled sequence. More specifically, conventional analog-type PLLs comprise a simple data slicer, phase detector and analog loop filter that, inherently, can be implemented with much lower degrees of latency. While not providing the discrete-time sample sequence required for PRML data recovery (which involves some form of soft decoding at the data recovery stage), these analog-type loops can be driven with fairly high gain and can therefore be more readily implemented to achieve acceptable capture ranges without losing basic system stability.

The use of PRML in an optical disc recovery environment is discussed in UK Patent Application No. 9800353.6. Additional reference is made to the following articles that provide background to the present invention: i) "A 240-Mps, 1-W CMOS EPRML Read-Channel LSI Chip Using an Interleaved Subranging Pipeline A/D Converter" by T. Matsuura et al, IEEE Journal of Solid-State Circuits, Vol. 33, No. 11, November 1998; ii) "A PRML Detector for a DVDR System" by C. H. Lee et al, IEEE Transactions on Consumer Electronics, Vol. 45, No. 2, May 1999; and iii) "Transition Detector for CD and DVD" by J. W. M. Bergmans et al, IEEE Transactions on Consumer Electronics, Vol. 46, No. 1, February 2000.

SUMMARY OF THE INVENTION

The present invention is a method of acquiring phase lock to a data signal in a digital channel having a digital feedback loop. The method generally comprises: (A) applying the data signal to an analog phase lock loop configured to have (i) at least two poles and (ii) present an intermediate output signal frequency locked to the data signal; (B) applying the data signal and the intermediate output signal to the digital channel; and (C) adjusting a delay constant for the digital feedback loop to (i) compensate for variations in phase between the data signal and the intermediate output signal and (ii) acquire phase lock by using a single pole in the digital channel.

In one embodiment, the digital channel may include a digital to analog converter (DAC) coupled to a delay cell that may provide the delay constant. The DAC may respond to a control signal from a digital loop filter providing a single pole in the digital channel. The method may further comprise scaling the DAC such that the control signal may fall within a full scale deflection control range of the DAC and such that a positive full scale deflection (+FS) is designed to provide a delay of one clock period through the delay cell whereas negative full scale deflection (−FS) provides delay of two clock periods through the delay cell.

Preferably, the control signal may modulate an input current signal (e.g., I) to the DAC to provide a control current signal (e.g., IOUT). The input current signal I may provide a drive current for a ring oscillator of the digital channel and wherein the control current signal IOUT adjusts the delay constant to reflect a relationship:

$$IOUT = 2I/3 + NI/3FS$$

wherein: IOUT is the control current signal;
N is the control signal;
I is the input current signal; and
FS is the full scale deflection of the DAC.

The delay constant is generally provided by a plurality of serially coupled buffer cells having a first cell responsive to the intermediate output signal and a last cell providing, in use, a reference clock signal for the digital channel.

In a particular embodiment, the method may further comprise: generating an in-phase and an anti-phase versions of the intermediate output signal; applying the in-phase intermediate output signal to clock the PLL; and applying the anti-phase version of the intermediate output signal to the digital feedback loop.

An analog PLL may be used to obtain accurate frequency lock between a reference clock and a read channel signal. The analog PLL may use at least a second order configuration providing a plurality of poles. A resultant frequency locked signal may then applied to a first order digital delay lock loop (DLL) that acquires phase lock, which being a first order digital DLL is latency tolerant.

In another aspect of the present invention there is provided a method of timing recovery in a system configured to support a partial response maximum likelihood processing technique. The method generally comprises applying a data signal to an analog phase lock loop (PLL) having a plurality of degrees of system operation, the PLL providing an intermediate output signal that is frequency locked to the data signal. A digital representation of the data signal may then be applied to a digital delay lock loop (DLL) having a single degree of system operation, the digital DLL clocked by the intermediate output signal. Furthermore, the digital DLL may comprise a delay cell having an adjustable delay constant arranged to compensate for variations in phase between the data signal and the intermediate output signal, thereby to acquire phase lock with the digital signal in the digital DLL.

The adjustable delay constant may be generated by an array of buffer elements that are responsive to a modulated control current. The modulated control current may be a function of at least a digitally determined phase error. The method may include adjusting a sampling clock within a phase delay range between T and 2T, where T is a period of a ring oscillator.

In another aspect of the present invention there may be provided a phase acquisition circuit comprising an analog phase lock loop and a digital delay lock loop. The analog phase lock loop may be responsive to a data signal and operationally clocked with a clock signal frequency locked to the data signal. The analog phase lock loop may contain a plurality of operational poles supporting at least second order operation. The digital delay lock loop (DLL) may have a single pole. The delay lock loop may be coupled to the analog phase lock loop. The delay lock loop is generally arranged to receive, in use, the data signal. A delay cell within the digital delay lock loop may provide a delay constant arranged to adjust a phase difference between data signal and the clock signal to attain phase lock within the phase acquisition circuit.

The analog phase lock loop may have a first output providing an in-phase clock signal and a second output providing an anti-phase clock signal. The in-phase clock signal may be fed back within the analog phase lock loop. The delay lock loop may further comprise a delay cell coupled to a digital phase detector-loop filter circuit. The delay cell may be coupled to the second output of the analog phase lock loop.

The phase acquisition circuit may further include a digital to analog converter (DAC) coupled between the digital phase detector-loop filter circuit and the delay cell. The DAC is generally responsive to a control signal generated by the digital phase detector-loop filter combination. The control signal may be indicative of a digitally determined phase error in the digital DLL.

The DAC may be scaled such that the control signal falls within a full scale deflection control range of the DAC. The scaling may be such that a positive full scale deflection (+FS) is designed to provide a delay of one clock period through the delay cell whereas negative full scale deflection (−FS) provides a delay of two clock periods through the delay cell.

The control signal may be arranged to modulated an input current signal I to the DAC to provide a control current signal IOUT. The input current signal I may provide a drive current for a ring oscillator of the digital DLL. The control current signal IOUT may adjust the delay constant to reflect a relationship:

$$IOUT=2I/3+NI/3FS$$

wherein: IOUT is the control current signal;
N is the control signal;
I is the input current signal; and
FS is the full scale deflection of the DAC.

The present invention is particularly applicable in situation in which the delay lock loop supports a partial response maximum likelihood signal processing technique, such as within an optical disc device (like a DVD player or recorder). Advantageously, the present invention may provide a circuit that supports timing recovery in PRML while mitigating latency issues through the use of a delay lock loop (DLL) that provides phase lock to a signal that is accurately frequency locked from an analog phase lock loop having multiple poles.

The provision of a delay cell may cause a fine adjustment of a phase relationship between a reference clock and a data sample. In contrast with prior art circuitry, the phase detector and loop filter of the present invention therefore generally only operates to drive the delay cell (which contrasts with the conventional requirement to also drive a suitable oscillator), whereby the present invention may provide the feedback loop with a single pole at the loop filter. Consequently, the circuit of the present invention may be easier to handle, can be driven with greater gain and is tolerant of latency issues. Implementation of the present invention therefore generally encourages use of PRML principally to address noise, with the increased ability to use a Viterbi decoder generally providing an improved data recovery mechanism. By virtue of providing a first order feedback system, the PRML DLL of the present invention is generally far more tolerant of latency with respect to its effect on system instability than second order digital PLLs hitherto used. Consequently, the preferred embodiment may achieve acceptable capture ranges without having to constrain severely the design of a PRML timing recovery loop to a configuration with difficult-to-implement low degrees of latency.

BRIEF DESCRIPTION OF THE DRAWINGS

These and other objects, features and advantages of the present invention will be apparent from the following detailed description and the appended claims and drawings in which:

FIG. 1 is a schematic block diagram of a PRML (digital) PLL;

FIG. 2 shows variation of a conventional filter characteristic with varying numbers of filter poles;

DETAILED DESCRIPTION OF THE PREFERRED EMBODIMENTS

Figure 3:
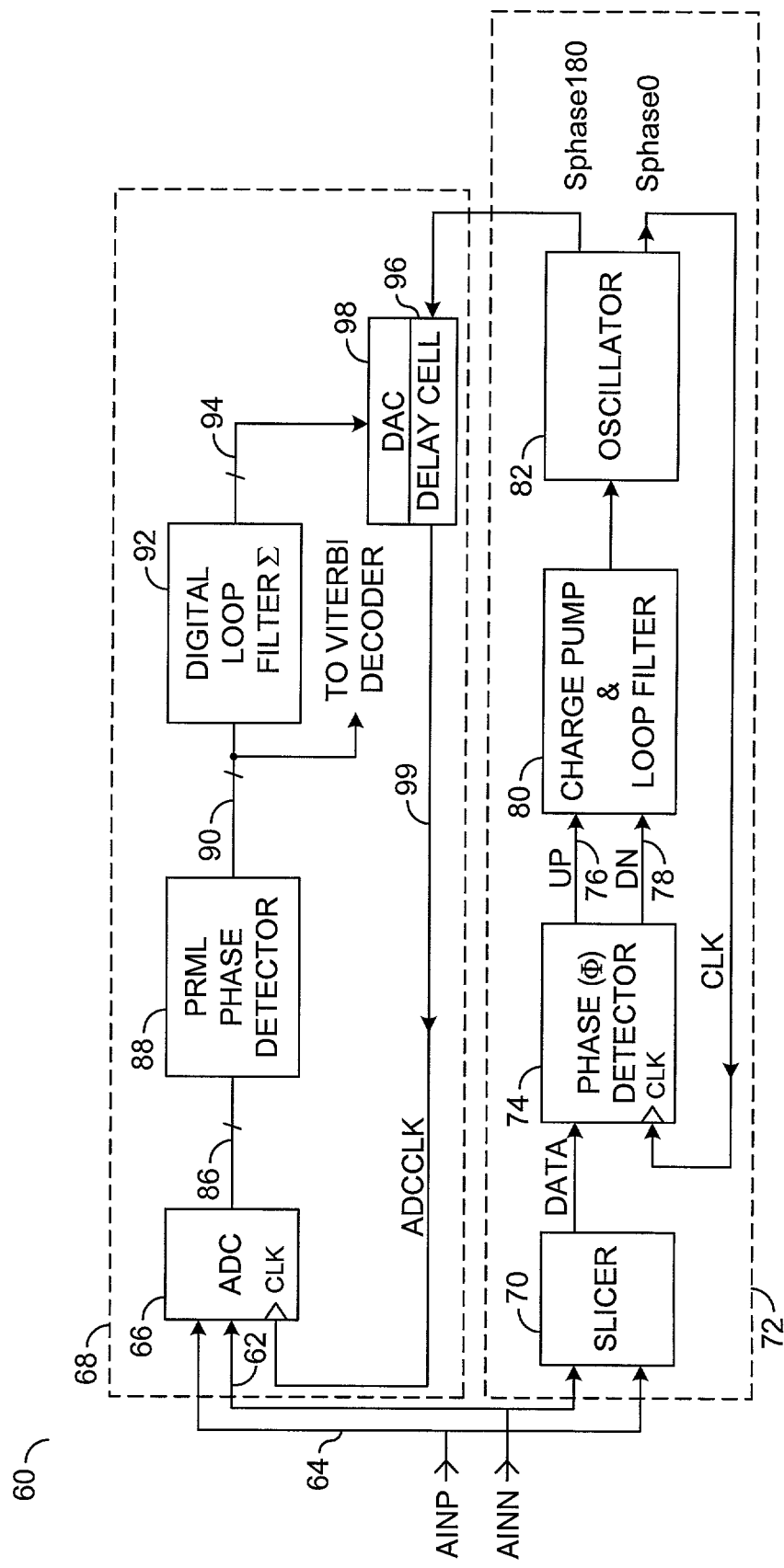
FIG. 3 is a schematic block diagram of a circuit according to a preferred embodiment of the present invention.

For a complete understanding, reference is initially made to FIG. 1 that shows a schematic block diagram of a conventional PRML (digital) PLL 10. The PRML PLL 10 includes digital circuitry 12 and some analog circuitry 14. An analog to digital converter (ADC) 16 receives an analog waveform 18 as a first input. A sample sequence 20 (in the form of a parallel data word) is output from the ADC 16, with the sample sequence 20 applied to equalization circuitry 22, such as an FIR filter. An output from the equalization circuitry is applied both to a Viterbi decoder 24 for data recovery and also to a phase detector 26. A phase error control word 28 is communicated via a loop filter (Σ) 30 to a digital to analog converter (DAC) 32. Typically, the loop filter 30 employs an accumulator or summer, which is itself realized with a feedback path in which an output from a clocked flip-flop is combined with an input to the flip-flop. An output 34 from the DAC 32 is applied to a voltage controlled oscillator (VCO) 36, which outputs are typically scaled replicas of the input to the DAC 32. The VCO 38 provides a clock signal 38 that is applied to clock the analog waveform 18 into the ADC 16.

With respect to FIG. 2, there is shown how a conventional filter characteristic 40 varies according to a varying number of filter poles associated with the filter. Essentially, looking to the frequency cut-off point ($f_c$) at −3 decibels (dB), roll-off of the characteristic is more severe with ever increasing numbers of poles. In other words, a gradient of the roll-off is defined by the number of poles associated with the filter, with the number of poles commonly referred to as the "degree of the system". As previously indicated, increasingly higher orders (i.e., higher numbers of degree) of a system result in the system becoming more difficult to stabilize because of the increasing steepness in the gradient of the roll-off.

FIG. 3 is a schematic block diagram of a circuit 60 according to a preferred embodiment of the present invention. In overview, the present invention generally uses an analog PLL to give accurate frequency lock between a clock and a data signal, with a digital delay lock loop (DLL) receiving the clock to fine adjust a phase relationship between the clock and the data signal. In particular, the system may use a first order DLL in order to support, for example, the use of PRML data recovery techniques. The use of a first order DLL therefore generally provides a digital circuit aspect that is highly tolerant of high levels of latency, whereas the initial frequency acquisition in the analog PLL domain may utilize multiple poles because of an inherently low relative latency.

Returning to discuss the detail of FIG. 3, while the embodiment is shown to be of a differential input form, the underlying principles of the present invention may be applicable to single input systems. Therefore, a differential data signal (e.g., signal AIN comprising AINP and AINN) may be received at a first input 64 and a second input 62 and applied in parallel to both an ADC 66 (of a digital delay lock loop 68) and a data slicer 70 (e.g., sampling circuit) of an analog phase lock loop (PLL) 72. The PLL 72 may further include a phase (Φ) detector 74 coupled to receive sampled data from the data slicer 70. The phase detector 74 generally operates to provide control pulses (labelled "up" and "down") to affect behaviour of a charge pump and loop filter circuit 80. An output from the charge pump and loop filter circuit 80 may be applied to an oscillator (typically a VCO) 82 that provides a clock signal (e.g., CLK) to a clock input to the phase detector 74 and a clock input to the ADC 66 of the DLL 68. A first clock signal (e.g., Sphase0) may be in anti-phase with a second clock signal (e.g., Sphase 180) provided to the DLL 68.

The phase (Φ) detector 74 generally operates in a conventional fashion to detect edge transitions. The charge pump and loop filter circuit 80 may provide a first pole for the PLL 72, with the loop filter typically realized by an resistor-capacitor combination. The oscillator 82 may, in the frequency domain, be considered to be representative of a filter, hence the oscillator 82 may provide a second pole.

A digital representation (e.g., a sample sequence) 86 of the signal AIN at the first input 64 and the second input 62 may be provided to a PRML-type phase detector 88, such as that disclosed in UK patent application 9800353.6. A phase error signal 90 may be presented from the PRML-type phase detector 88 and applied to a digital loop filter (Σ) 92. A control signal 94 presented from the digital loop filter 92 may be in the form of a parallel word (e.g., N) which control signal 94 is a function of the phase error. The control signal 94 may be applied to a delay cell 96 via a DAC 98, with the delay cell actually configured to receive the clock signal Sphase 180 (anti-phase) from the oscillator 82. A signal (e.g., ADCCLK) presented from the delay cell 96 (described in detail in relation to FIG. 4) generally provides a clock reference to the ADC 66 of the DLL 68.

By way of intermediate architectural summary, an analog type PLL 72 may be employed to achieve an accurate frequency lock to the incoming data signal AIN, with an output of the analog PLL 72 married up with a PRML delay lock loop (DLL) 28 whose function it is to accurately determine the final phase relationship of a sampling clock of an ADC 66. Since an oscillator does not form part of a feedback loop in the PRML DLL 68, a resultant digital loop may be effectively a first order feedback system having only a single pole provided by an accumulator connected to the output of a PRML phase detector 88. The ADC 66 may be realized as a flash device.

In operation, the DLL 68 may be enabled only after the analog PLL 72 has achieved frequency lock. Consequently, a frequency of the clock signal ADCCLK of the ADC 66 may always be locked to the incoming data signal AIN before the DLL 68 is enabled. Variations in phase between the data signal AIN applied to the ADC 66 of the DLL 68 and the clock signal Sphase180 that is presented from the oscillator 82 of the PLL 72 generally arise from mismatches between the two respective paths through the circuitry. The variations may be addressed by the delay cell 96 fine adjusting the clock signal Sphase180 that provides the clock signal ADCCLK to the ADC 66 of the DLL 68. The phase alignment of the clock signal Sphase180 with the data signal AIN therefore addresses any latency difference between the conventional (e.g., threshold detection) channel in the PLL 72 and that in the digital (e.g. PRML) channel of the DLL 68.

Figure 4:
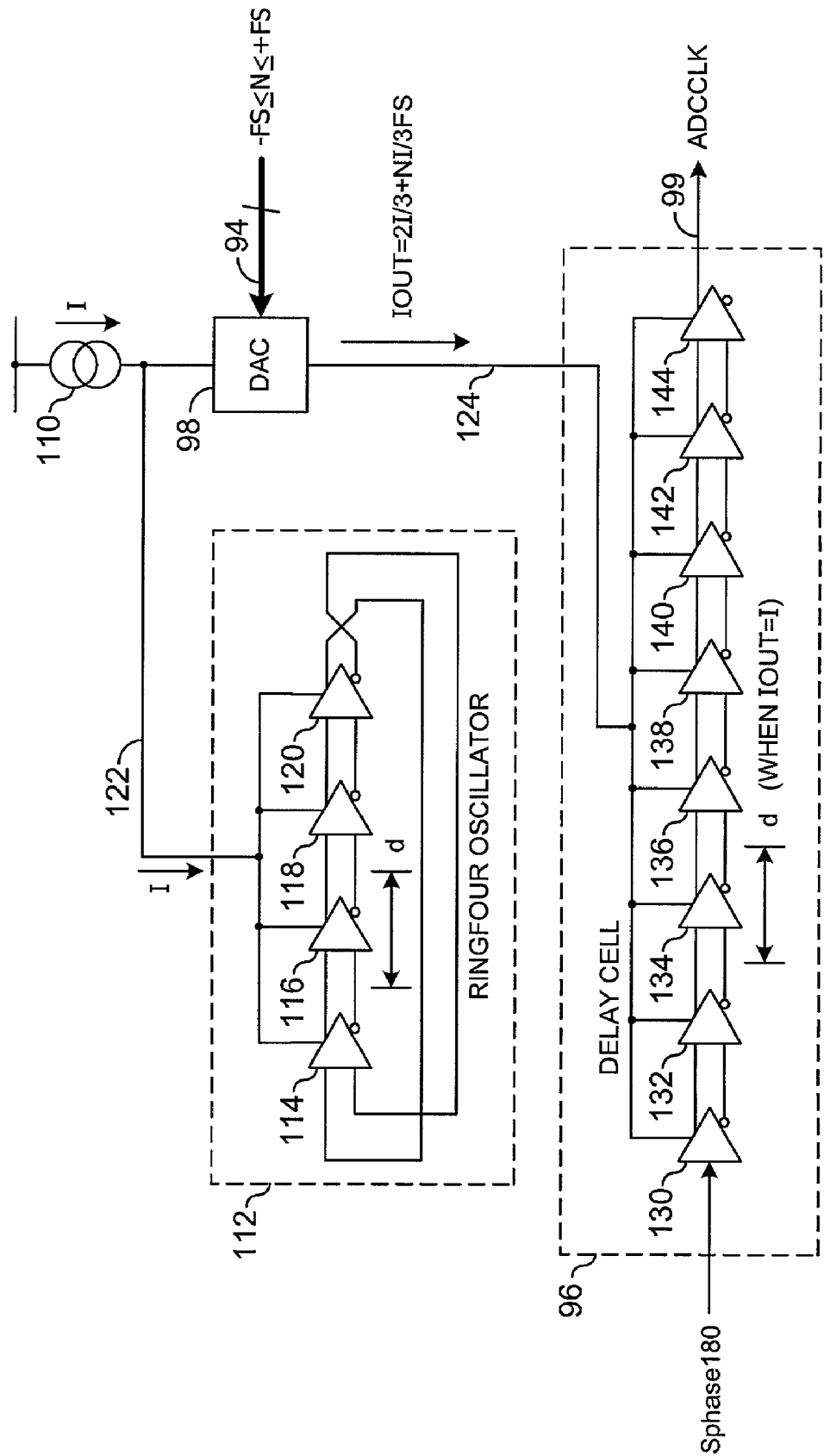
FIG. 4 shows an embodiment of a delay cell for use in the circuit of FIG. 3.

FIG. 4 shows a delay cell suitable for use in the circuit of FIG. 3. As shown in FIG. 4, the delay cell 96 is generally coupled to a current source 110 through the DAC 98. A four-ring oscillator 112 (subsequently generally referred to a as a "ringfour" oscillator) is generally arranged to oscillate constantly and therefore never stabilize, with the ringfour oscillator 112 coupled to the current source 110 and the DAC 98. The ringfour oscillator 112 is shown in differential form for exemplary purposes. The ringfour oscillator 112 may include a series of four buffer cells 114–120 each responds to an input current signal (e.g., I) 120. By way of generic description, each inverting output of each buffer cell is generally fed into a true input of a successive buffer cell, while each non-inverting output is fed to the inverting input of the successive buffer cell. With respect to a final buffer cell 120 in a chain of buffer cells, the inverted output may be fed back to a true input in a first buffer cell 114 of the chain, while the non-inverting output is fed back to the inverting input of the first buffer cell 114. The ringfour oscillator 112 may therefore exhibit a period of 8d, where d is the delay through a single delay cell. The various delay cells (or buffers) of the ringfour oscillator 112 may operate, as will be understood, to provide individual delays that are a function of the input current signal I. Specifically, the higher the input current signal I, the lower delay and hence the higher the output frequency of the ringfour oscillator 112.

Turning to the DAC 98, control of the DAC 98 is generally via the control signal 94 from the digital loop filter 92. The control signal 94, may be arranged to fall within the control range $-FS \leq N \leq FS$, where ±FS is the full scale deflection of the DAC 98. More specifically, +FS may be designed to provide an exact delay of one clock period through the delay cell 96, whereas −FS may provide an exact delay of two clock periods through the delay cell 96. As previously indicated, control signal N may be a function of the measured phase error and, in this respect, a current output signal (e.g., IOUT) 124 from the DAC 98 reflects the relationship in the following Eqn. 1:

$$IOUT = 2I/3 + NI/3FS$$

wherein: IOUT is the control current signal;

N is the control signal;

I is the input current signal; and

FS is the full scale deflection of the DAC.

The current output signal IOUT 124 may therefore be a modulated version of the original input current signal I from the current source 110, with the original input current signal I modulated by a number that is derived from the digital loop filter 92 and hence the phase error signal 90. In other words, Eqn. 1 above may provide a mechanism by which a sampling clock can be adjusted over all values of a phase delay range between T and 2T, where T is the period of the ringfour oscillator 112. For the avoidance of doubt, the oscillator 82 in the analog PLL 72 and the ringfour oscillator 112 are one in the same, with the period of oscillation equal to T=8d. The frequency of the clock signal Sphase 180 may be the same as the frequency of the ringfour oscillator 112.

The current output signal IOUT 124 may be applied to control inputs of a succession of series-coupled buffer cells 130–144 of the delay lock loop 68. With a ringfour oscillator 112 configuration, the delay cell 96 therefore may include a series of eight delay cells 130–144 to reflect the period of the ringfour oscillator 112, with each delay cell 130–144 providing a delay of d when IOUT=I. Again, for exemplary purposes, the delay cells (or buffers) 130–144 of the delay lock loop 68 are shown in differential form.

In terms of circuit operation, the present invention generally makes use of an autocalibration technique within the delay cell 96. More specifically, in a similar fashion to that employed with a half-cell element in a conventional timing recovery loop, the various delay elements 130–144 in the delay cell will be closed/disabled in order that the ringfour oscillator 112 reaches a desired output oscillation frequency.

With respect to the ringfour oscillator 112 of the analog PLL 72, this component requires autocalibration. As will be understood by one of ordinary skill in the art, any PLL (such as the second order type of FIG. 3) may have a restricted capture range of about ±5%. Consequently, the oscillator generally needs to be centered. For example, the operating frequency of the oscillator needs to be set to within about a 5% range of an expected incoming frequency. Centering of the oscillator frequency therefore may form a first requirement in the autocalibration process.

Autocalibration of the oscillator may also set a gain of the oscillator. As will be understood, the gain may have a direct bearing on the closed-loop (e.g., feedback) dynamics of the PLL that in turn affect parameters such as capture range and lock acquisition times. Generally, it is preferred that the gain is made user programmable, with the autocalibration cycle therefore also responsible for setting the gain of the oscillator to the target gain stipulated by the user. With manufactured oscillator circuitry having varying performance characteristics arising from processing differences in internal resistor and capacitor values and transistor gains, the autocalibration routine may instigated every time the user changes the PLL configuration. The autocalibration routine may also calibrate the delay cell 96 (of FIG. 4) to ensure that, for a given setting of the input current signal I, the frequencies of both the ringfour oscillator 112 and the delay cell 96 are matched. In summary, autocalibration therefore generally: i) sets up the center frequency of the oscillator to reflect the user's preference (e.g., typically within 5% of the expected incoming signal frequency); ii) sets up the gain of the oscillator to satisfy user requirements; and iii) ensures calibration between ringfour oscillator 112 and the delay cell 96. The autocalibration routine therefore may ensure that the user's requested center frequency and gain settings are met regardless of the processing differences that exist between different manufactured parts.

The delay cell 96 generally comprises the inverter cells 114–120 in a current ringfour oscillator circuit 112 and auxiliary inverter cells 130–144 responsive to a modulated current from a DAC 98. Each of the four inverter cells 114–120 in the ringfour oscillator 112 generally have a delay (e.g., d) which may be governed by the input current signal I from a current source 110. Each output stage of each inverter 114–120 may be fed into a contiguous input stage such that a positive rising edge at the input(s) of the first inverter cell 114 will propagate through to the output(s) of the final inverter stage 120 in a time of 4d. However, with the output(s) of the final stage 120 being flipped around and applied back to the input(s) of the first stage 114. The first stage may consequently see a negative-going edge that, in turn, propagates through to the output(s) of the of the final stage 120 in a time of 4d. Therefore, the output(s) of the final stage 120 of the ringfour circuit 112 may be switched at intervals of 4d, whereas the period T between a rising-to-rising (or falling-to-falling) edge is T=8d. With the delay cell 96 further containing eight similar inverter cells, the delay through the complete delay cell 96 may therefore be T for a governing current of the input current signal I. With the DAC 98 used to modulate the current governing the delay through the inverters in the delay cell, the control current signal IOUT may be allowed to modulated between a value of I and a value of I/2, such that a total delay through the delay cell 96 may be between T and T/2.

During normal read operation, the clock signal Sphase180 may be applied to the delay cell 96 and the DAC code is allowed to move within the range of ±FS. From Eqn. 1 above, it can be seen that the DAC 98 is generally designed such that the control current signal IOUT at a point when –FS is applied to the DAC 98 may be a third of the control current signal IOUT for when +FS is applied to the DAC 98. In this way, the delay provided by the delay cells 130–144 may be modulated in the range of T to 2T. It should be noted that a characteristic supporting a minimum control current signal IOUT of I/3 is generally chosen to allow for a non-linear delay in the delay cells having regard to current characteristics exhibited by the delay cells 130–144, notwithstanding that the circuit could, in theory, operate with a current in the range between I and I/2. It therefore follows that the clock signal ADCCLK provided to the ADC 66 may be a delayed version of clock signal Sphase180, where the delay may be varied between T and 2T. In turn, the delay may support a phase adjustment range between ±T/2 around Sphase0 (e.g., the actual clock edge that is phase locked to the data signal AIN).

Figure 5:
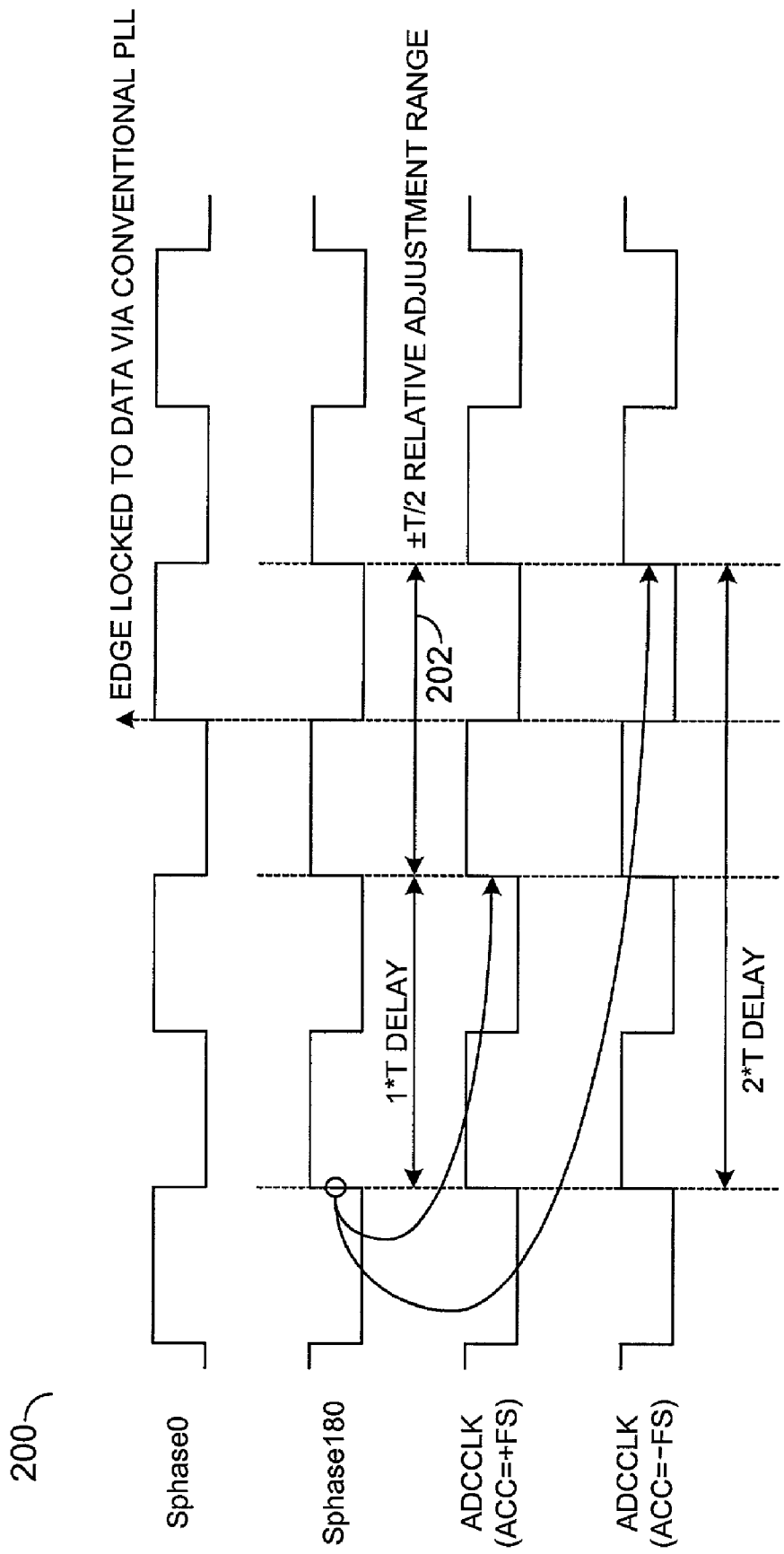
FIG. 5 is a diagram illustrating system timing relationships of PLL in-phase and anti-phase clock signals with respect to delay lock loop operation.

FIG. 5 is a diagram illustrating system timing relationships 200 of PLL in-phase clock signal Sphase0 and anti-phase clock signal Sphase180 with respect to delay lock loop operation consistent with a preferred embodiment of the present invention. With the in-phase clock signal Sphase0 may have its edge locked to the data signal AIN via the analog PLL 72, it can be appreciated that the phase error may therefore only ever be a maximum of half a period ahead or behind the sampling clock signal ADCCLK (incident to the ADC 66). Furthermore, the amount of variation 202 in the output from the delay cell 96 may be restricted to ±T/2 with respect to a zero degree positive edge of the definitive system clock (e.g., clock signal Sphase0).

Figure 6:
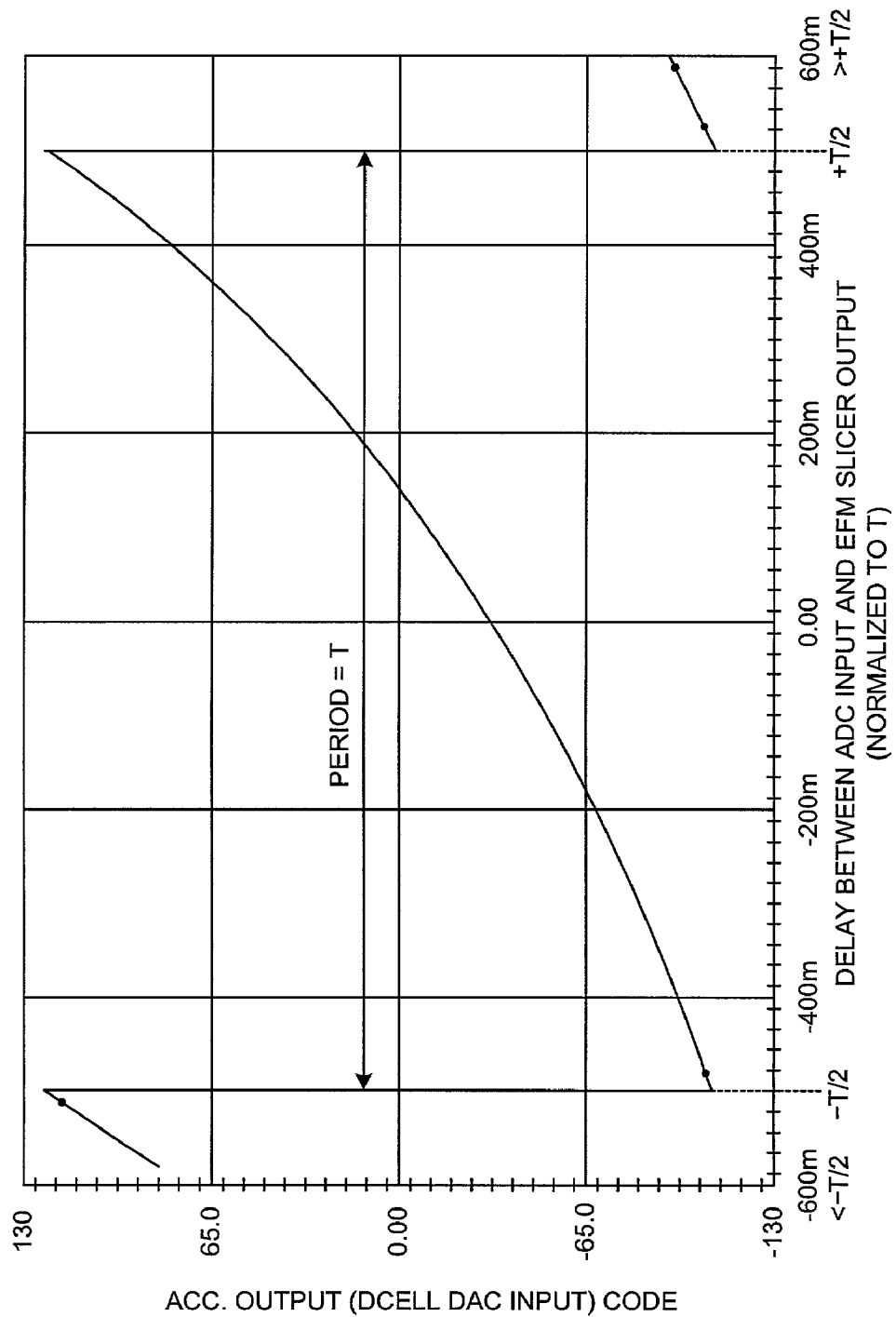
FIG. 6 is a plot of phase error against convergence value generated from the loop filter of FIG. 3.

Operation of the delay lock loop may be such that, if a delay mismatch between the analog data AIN received at the inputs signal 62–64 arriving at the inputs of the ADC 66 and the sliced g efm streams is varied between –T/2 to +T/2, the system generally exhibits a DLL system discrimination characteristic as shown in FIG. 6. Essentially, the abscissa may be a magnitude of the phase error between the analog data signal AIN arriving at the inputs of the ADC 66 and the sliced efm streams presented from the slicer 90 in the PLL 72. The ordinate axis may be representative of the DAC convergence value N required to phase align the analog data signal AIN with the sliced efm streams, with the convergence value N generated from the digital loop filter 92.

In order to avoid any erroneous decision-making by the slicer 70 that could trigger the DLL 68 to move away from phase acquisition in operational situations close to ±T/2 window boundaries, one embodiment of the present invention contemplates the use of a feedback control signal from the Viterbi decoder to the slicer 90 to at least reduce (and preferably eradicate) the likelihood of false DLL operation.

As regards the digital loop filter 92 of the DLL 68, the present invention generally realizes the digital loop filter 92 with a combination of an integrator accumulator and the delay DAC 98. For an eight-bit delay DAC 98 (believed to provide the requisite resolution), computed mean squared error (MSE) values of the phase error after acquisition of DLL (phase) lock suggest that a 13-bit accumulator may be particularly suited in the role of a digital loop filter. Of course, smaller and larger scaled accumulators could be used, with phase acquisition affected by associated signal processing overhead. To avoid system saturation at the ±T/2 boundaries, the accumulator may support full wrap-around (as illustrated in FIG. 6). In other words, to avoid system saturation at the ±T/2 boundaries, implementation of the digital loop filter 92 may avoid the use of saturation logic with the integrator accumulator.

With no effective oscillation in the DLL 68, the phase detector 88 and the digital loop filer 92 generally provide a solitary pole to the circuit 60, resulting in the DLL 68 attaining a first degree operational status that is generally tolerant to latency and relatively easy to drive and synchronise. With improved tolerance to latency, the present invention may also be suited to application in sub-five volt architectures, including those based on piping methodologies.

Figure 7:
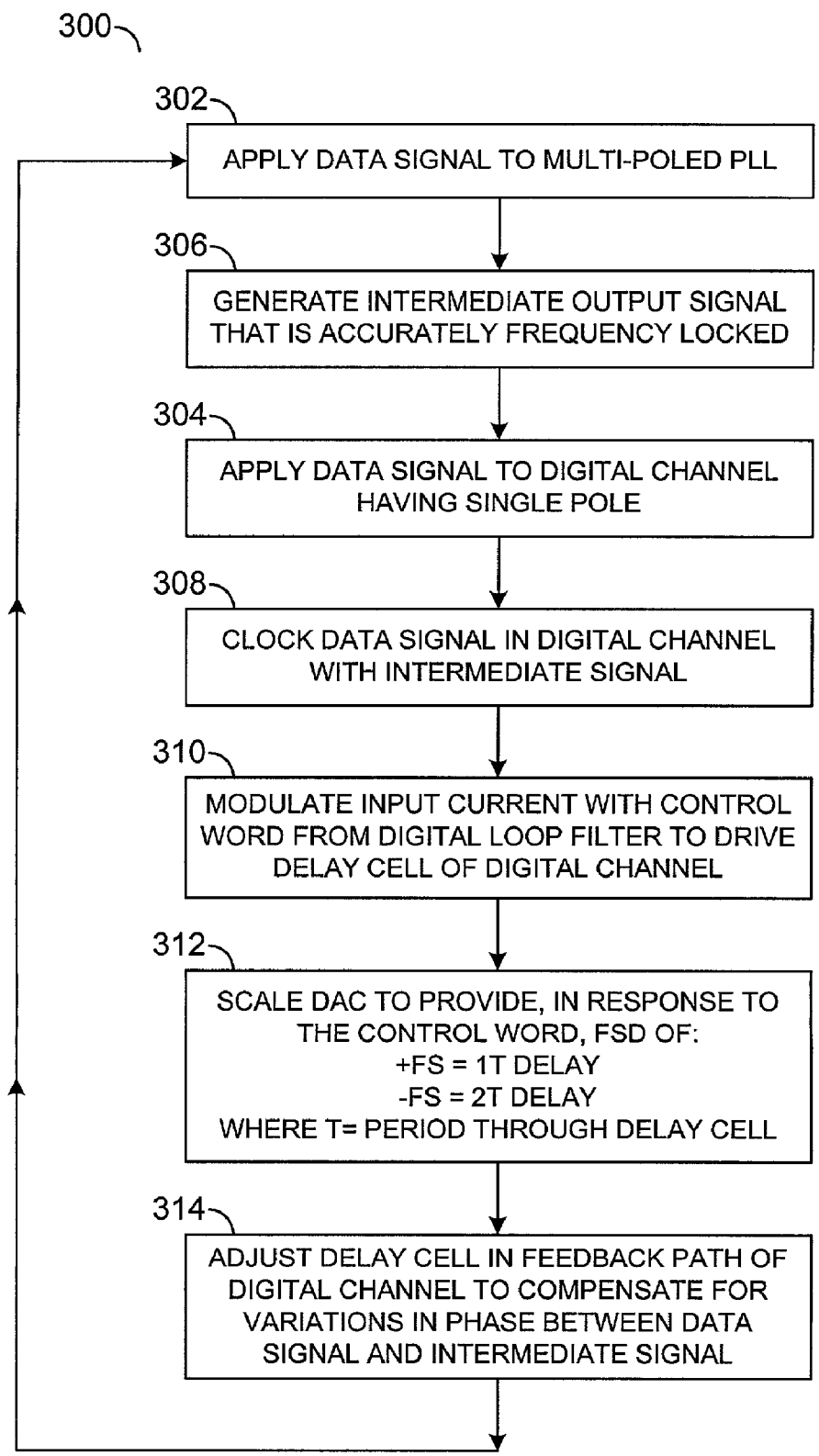
FIG. 7 is a flow diagram of an operating methodology for acquiring phase lock

In final overview, the process of acquiring phase lock is shown in the flow diagram 300 of FIG. 7. The data signal AIN may be applied both to the multi-poled analog PLL 72 (e.g., step 302) and also the single-poled digital channel 68 (e.g., step 304). In the analog PLL 72, an intermediate output signal having frequency lock may be obtained (e.g., step 306). The data signal AIN may be clocked (e.g., step 308) into the digital channel 68 by the intermediate output signal. To drive a ring oscillator in the digital channel 68, the input current signal I may be modulated (e.g., step 310) with a control signal N from the digital loop filter 92, with the control signal N causing scaling (e.g., step 312) within the DAC 96 of the digital channel 68 such that full scale deflection of +FS provides a delay of one T period and a full scale deflection of –FS provides a delay of two T periods. Adjustment (e.g., step 314) of a delay in the delay cell may then compensate for variations in phase between the data signal AIN and the intermediate signal and such that phase acquisition may achieved in the digital channel 68.

Although the preferred operating method is realised by general or specific-purpose processor or logic circuits programmed with suitable machine-executable instructions, hardware components may possibly be used to implement certain features of the present invention. Of course, the present invention may be performed by a combination of hardware and software. Software embodiments of the invention may be implemented in any conventional computer programming language or code modules. For example, embodiments may be implemented in a procedural programming language (e.g. "C")or an object oriented programming language (e.g. "C++")or in specific hardware description languages (e.g. "verilog" and "VHDL".

It will, of course, be appreciated that the above description has been given by way of example only and that modifications in detail may be made within the scope of the present invention. For example, while the preferred embodiment of the present invention finds particular application in an optical read channel supporting eight-fourteen modulated data and in the context of a PRML data recovery environment, the underlying principle has broader application to systems that operate to acquire phase lock timing recovery in a digital channel, e.g. cellular telephony equipment.

While the invention has been particularly shown and described with reference to the preferred embodiments thereof, it will be understood by those skilled in the art that various changes in form and details may be made without departing from the spirit and scope of the invention.

What is claimed is:

1. A method of acquiring phase lock to a data signal in a digital channel having a digital feedback loop, the method comprising the steps of:
    (A) applying said data signal to an analog phase lock loop configured to (i) have at least two poles and (ii) present an intermediate output signal frequency locked to said data signal;
    (B) applying said data signal and said intermediate output signal to said digital channel;
    (C) adjusting a delay constant for said digital feedback loop to (i) compensate for variations in phase between said data signal and said intermediate output signal and (ii) acquire phase lock by using a single pole in said digital channel; and
    (D) scaling a control signal such that said delay constant varies between one clock period and two clock periods.

2. The method according to claim 1, further comprising the steps of:
    modulating an input current signal in response to said control signal to present a control current signal; and
    adjusting said delay constant in response to said control current signal to reflect a relationship:

$IOUT=2I/3+NI/3FS$ wherein: IOUT is said control current signal;
    N is said control signal;
    I is said input current signal; and
    FS is a full scale deflection of said digital to analog conversion.

3. The method according to claim 1, further comprising the step of driving an oscillator of said digital channel with an input current signal.

4. The method according to claim 1, further comprising the step of buffering said intermediate output signal through a plurality of delay cells responsive to a control current signal to produce said delay constant.

5. The method according to claim 4, wherein said plurality of delay cells each provide substantially identical delays.

6. The method according to claim 1, further comprising the step of:
    presenting an in-phase intermediate output signal and an anti-phase intermediate output signal in response to applying said data signal to said analog phase lock loop.

7. The method according to claim 1, further comprising the step of performing a partial response maximum likelihood phase detection for said data signal to present a phase error signal.

8. The method according to claim 7, further comprising the steps of:
    filtering said phase error signal in said digital channel to present a control signal;
    scaling said control signal such that said delay constant varies between one clock period and two clock periods;
    modulating an input current signal in response to said control signal to present a control current signal;
    adjusting said delay constant in response to said control current signal; and
    buffering said intermediate output signal through a plurality of buffer cells responsive to said control current signal to produce said delay constant.

9. A circuit comprising:
    an analog phase lock loop configured to (i) respond to a data signal, (ii) be clocked with a clock signal frequency locked to said data signal and (ii) have a plurality of operational poles supporting at least second order operation; and
    a digital delay lock loop configured to (i) have a single pole, (ii) coupled to said analog phase lock loop, (iii) receive said data signal and (iv) provide a delay constant arranged to adjust a phase difference between said data signal and said clock signal to attain phase lock within said circuit, wherein said analog phase lock loop is further configured to present an anti-phase clock signal for use in said digital delay lock loop.

10. The circuit according to claim 9, wherein said delay lock loop comprises:
a digital phase detector-loop filter circuit; and
a delay cell configured to (i) couple to said digital phase detector-loop filter circuit and (ii) receive an anti-phase clock signal.

11. The circuit according to claim 10, wherein said delay lock loop further comprises a digital to analog converter configured to (i) couple between said digital phase detector-loop filter circuit and said delay cell and (ii) respond to a control signal generated by said digital phase detector-loop filter circuit, wherein said control signal is indicative of a digitally determined phase error in said digital delay lock loop.

12. The circuit according to claim 9, wherein said delay lock loop comprises a digital to analog converter configured to scale a control signal to provide said delay constant between one clock period and two clock periods.

13. The circuit according to claim 12, wherein said control signal is arranged to modulate an input current to said digital to analog converter to provide a control current signal that adjusts said delay constant to reflect a relationship:

$$IOUT=2I/3+NI/3FS$$

wherein: IOUT is said control current signal;
N is said control signal;
I is said input current signal; and
FS is a full scale deflection of said digital to analog conversion.

14. The circuit according to claim 9, wherein said delay lock loop comprises an oscillator responsive to an input current signal.

15. The circuit according to claim 9, wherein said delay lock loop supports a partial response maximum likelihood signal processing technique.

16. A circuit comprising:
first means for presenting an intermediate output signal frequency locked to a data signal, said first means for presenting configured as (i) an analog circuit (ii) having at least two poles;
second means for presenting a digital representation of said data signal, said second means for presenting configured as (i) a digital channel (ii) having a single pole;
means for adjusting a delay constant within said second means for presenting to (i) compensate for variations in phase between said data signal and said intermediate output signal and (ii) acquire phase lock by using a single pole in a digital feedback loop of said digital channel;
means for filtering a phase error signal in said digital channel to present a control signal; and
means for scaling said control signal such that said delay constant varies between one clock period and two clock periods.

17. A method of acquiring phase lock to a data signal in a digital channel having a digital feedback loop, the method comprising the steps of:
(A) applying said data signal to an analog phase lock loop configured to (i) have at least two poles and (ii) present an intermediate output signal frequency locked to said data signal;
(B) applying said data signal and said intermediate output signal to said digital channel;
(C) adjusting a delay constant for said digital feedback loop to (i) compensate for variations in phase between said data signal and said intermediate output signal and (ii) acquire phase lock by using a single pole in said digital channel;
(D) filtering a phase error signal in said digital channel to present a control signal; and
(E) scaling said control signal such that said delay constant varies between one clock period and two clock periods.

18. A circuit comprising:
an analog phase lock loop configured to (i) respond to a data signal, (ii) be clocked with a clock signal frequency locked to said data signal and (iii) have a plurality of operational poles supporting at least second order operation; and
a digital delay lock loop configured to (i) have a single pole, (ii) coupled to said analog phase lock loop, (iii) receive said data signal and (iv) provide a delay constant arranged to adjust a phase difference between said data signal and said clock signal to attain phase lock within said circuit,
wherein said analog phase lock loop is further configured to present (a) an in-phase clock signal for use within said analog phase lock loop and (b) an anti-phase clock signal for use in said digital delay lock loop.

19. The circuit according to claim 9, wherein said analog phase lock loop is further configured to present an in-phase clock signal for use within said analog phase lock loop.

20. The method according to claim 6, further comprising the step of:
applying said in-phase intermediate output signal to said analog phase lock loop.

21. The method according to claim 20, further comprising the step of:
applying said anti-phase intermediate output signal to said digital feedback loop.

* * * * *